(12) United States Patent
Zelissen

(10) Patent No.: US 9,890,975 B2
(45) Date of Patent: Feb. 13, 2018

(54) THERMOELECTRIC HEAT TRANSFERRING SYSTEM

(71) Applicant: Marcus Jozef Gertrudis Zelissen, Maasbree (NL)

(72) Inventor: Marcus Jozef Gertrudis Zelissen, Maasbree (NL)

( * ) Notice: Subject to any disclaimer, the term of this patent is extended or adjusted under 35 U.S.C. 154(b) by 100 days.

(21) Appl. No.: 14/770,300

(22) PCT Filed: Feb. 25, 2013

(86) PCT No.: PCT/NL2013/000006
§ 371 (c)(1),
(2) Date: Aug. 25, 2015

(87) PCT Pub. No.: WO2014/129886
PCT Pub. Date: Aug. 28, 2014

(65) Prior Publication Data
US 2016/0003502 A1     Jan. 7, 2016

(51) Int. Cl.
*F25B 21/00* (2006.01)
*F25B 21/04* (2006.01)
*F25B 21/02* (2006.01)
*H01L 35/32* (2006.01)
*F25B 25/00* (2006.01)

(52) U.S. Cl.
CPC .............. *F25B 21/04* (2013.01); *F25B 21/02* (2013.01); *H01L 35/32* (2013.01); *F25B 25/005* (2013.01)

(58) Field of Classification Search
CPC ................. F25B 21/02; F25B 21/04
USPC ............................ 62/3.2, 3.3, 3.6, 3.7, 259.2
See application file for complete search history.

(56) References Cited

U.S. PATENT DOCUMENTS 4,848,090 A * 7/1989 Peters ..................... F25B 21/02
                                                          165/253
5,343,360 A * 8/1994 Sanwo .................. H01L 23/057
                                                          165/80.4

(Continued)

FOREIGN PATENT DOCUMENTS

DE      102010021901 A1    12/2011
WO        02086980 A1    10/2002

*Primary Examiner* — Melvin Jones
(74) *Attorney, Agent, or Firm* — King & Schickli, PLLC

(57) ABSTRACT

A thermal system, comprising a thermoelectric element arranged for a heat flux through the element from the cold side for heat uptake to the hot side for heat dissipation, wherein the heat uptake of the thermoelectric element is arranged by convention, the system further comprising a primary loop for accommodating a cooling liquid for transferring the heat away of the thermoelectric element, wherein the thermoelectric element is arranged for having a maximum heat transfer capacity being higher than the maximum heat dissipation capacity of the primary loop and/or wherein the system is arranged for, manipulation of the flow which affects the stagnant film layer at the heat transmitting surface of the thermoelectric element of the forced convection, to enhance the heat transfer coefficient, and/or wherein a part of the primary loop forms a liquid channel for the heat transmitting surface of the thermoelectric element wherein the direction of the flow is traversing the direction of the liquid flow of the opposite side of the thermoelectric element.

14 Claims, 14 Drawing Sheets

(56) References Cited

U.S. PATENT DOCUMENTS

| | | | |
|---|---|---|---|
| 7,508,671 B2 * | 3/2009 | Sauciuc | G06F 1/20 165/104.33 |
| 2006/0137360 A1 | 6/2006 | Ghoshal | |
| 2007/0101748 A1 | 5/2007 | Pham | |

* cited by examiner

THERMOELECTRIC HEAT TRANSFERRING SYSTEM

This application is the national stage of PCT/NL2013/000006, filed Feb. 25, 2013.

FIELD OF THE INVENTION

The invention relates to a thermal system provided with thermo electric elements, were the invention describes the conditions to accomplish enhanced and improved thermal heat transfer of the thermoelectric elements to create an overall better performing thermal system. The invention is in particular applicable and useful in thermoelectric systems where is made use of thermal heat transfer by means of convection with a liquid flow. The solution is even more applicable for a thermoelectric assembly wherein there is direct contact of the liquid to the thermoelectric elements that are embedded in flexible manner for maintaining reliability, durability and good lifetime as known from the invention WO02086980.

Background of the Invention

Such system can be used as cooling system or heating system, depending of which heat flux direction is chosen for the thermoelectric elements. A characteristic of such thermal system is that there are two loops, by means of a cooling channels, that consists of a relative cold loop and a relative warm loop wherein the thermoelectric element is arranged for transferring heat from a cold side for heat uptake to a hot side for heat dissipation, the system further comprising a primary loop for accommodating a cooling liquid for cooling the hot side, wherein the primary loop being arranged for heat dissipation from the cooling liquid to the surroundings of said cooling channel, such that said looping cooling channel has a heat dissipation capacity.

Such a cooling system is for instance known from a cabinetcooler wherein the heatsink and/or looping inside the cabinet is arranged for heat uptake, and a heatsink and/or radiator is placed outside the cabinet where the extracted heat is dissipated.

It is important for such cooling systems to keep the temperature of the heatsink and/or cooling liquid in the primary loop, preferably as low as possible maximized by the temperature of surroundings or medium whereto the heat is transferred, in order to let the thermoelectric cooling element work relatively good and/or relatively efficiently.

A problem associated with such known systems is that the thermoelectric element for the cooling system has a relative limited cooling capacity due to the limited heat transferring capacity what is often done with conduction and further on and/or otherwise by convection. Suppressing this problem by increasing the electric power to the thermoelectric cooling element, with the intension to create more cooling power, leads often to malfunction or negative results, or to relative huge cooling channels, heatsinks or large radiators being oversized for the most of the time the system is in active use/mode.

SUMMARY OF THE INVENTION

To increase the performance and efficiency of heat transferring system, the thermal heat transfer of the thermoelectric element in the embodiment is improved by:
arranging low temperature inlet of the liquid that absorbs the heat of the thermoelectric element,
arranging minimized stagnant film layer the heat transmitting surface of the thermoelectric element
arranging minimized thermal heat loss within the embodiment of the thermoelectric element The invention aims to provide an alternative heat transferring system. Preferably, the invention aims to provide a cooling system counteracting at least one of the problems associated with the known cooling systems. In particular, the invention aims to provide a heat transferring system, preferably a cooling system in which the advantage of relative small looping cooling channel is maintained, while the heat transferring capacity, or the so-called cooling capacity, of the system and/or the thermoelectric element is increased.

The invention thereto provides a heat transferring system, wherein the thermoelectric element is arranged for having, during use of the system in active mode, a maximum of relative high heat transferring capacity being higher than the maximum heat dissipation capacity of the cooling channel.

Surprisingly, it may be that by not cooling continuously, but by cooling with intervals only, the maximum heat dissipation capacity of the cooling channel does not need to match the size of the maximum heat transferring capacity of the thermoelectric element. By arranging the thermoelectric element for having a maximum heat transferring capacity, during use of the system, which is higher than the maximum heat dissipation capacity of the cooling channel, a relative large heat transferring capacity, or the so-called cooling capacity, can be provided.

Besides, a relative small cooling channel can be maintained, because the cooling liquid will not be heated too much if the thermoelectric element is only used temporarily.

Additionally of alternatively, the system can further have a heat storing capacity for storing a part of the heat transferred during temporary peak cooling by the thermoelectric element, which part of the heat may be dissipated to the surroundings of said cooling channel after said temporary cooling. Hence, it can be arranged that the cooling system works surprisingly well, although its thermoelectric element is arranged for having a maximum heat transferring capacity being higher than the maximum heat dissipation capacity of the cooling channel.

Preferably, the heat storing capacity of the hot side, is being arranged with the purpose and/or intention for heat dissipation from the primary loop out of the cooling channel.

Preferably, the system further comprises a heat storing reservoir for at least partly providing the heat storing capacity. In embodiments, the heat storing reservoir may, in use, accommodates more cooling liquid than the looping primary cooling channel does, preferably at least 50% more, more preferably at least 100% more, yet more preferably being at least 200% more, especially at least 500% more.

In an elegant manner, the heat storing reservoir, in use, accommodates phase-change material (PCM). Preferably, the melting temperature or range of the chosen PCM, or combinations of different PCM with different melting temperatures, is near the optimum temperature of the cooling channel when operating, so that temperature fluctuations or temperature raise are kept to a minimum. When PCM is melting at a certain temperature due to an increased temperature of the heated cooling liquid passing the PCM, said PCM is capable of absorbing and storing relative large amounts of energy on a stable temperature. This means that the temperature raise of the primary channel is being limited, preferably the same temperature as the PCM, causing higher performance and/or higher efficiency of the thermoelectric element. Said absorbed heat may be released/dissipated later on, for instance during intervals when the thermoelectric element is not cooling at its maximum capacity or is not cooling at all.

In an additional or alternative system, the heat flux direction through the thermoelectric elements is reversed to transfer the heat back to the original loop. This can easily be realized by reverse switching of the electric current to the thermoelectric elements.

In an alternative embodiment, the cooling system further comprises one or more heat dissipation units connected to the primary loop and/or the heat storing reservoir. Such heat dissipation unit or units can be used to cool the cooling liquid in the primary loop and/or in the heat storing reservoir. Hence, the cooling liquid can loose more heat than the cooling channel itself can dissipate. As a result, thermoelectric element with a relative large capacity can be used in combination with a relative small cooling channel of the primary loop.

In preferred embodiments, at least one, each or more heat dissipation units are selected from a group comprising: a radiator, heat exchanger, heatsink, heat storage buffer, Phase Change Material (PCM), liquid cold plates, heat spreaders, heatpipes, fine wire heat exchanger, Phase Change Coolers, a fan cooled heat exchanger, liquid to liquid heat exchanger, vapour compression cooler, evaporative cooler, vessel, open loop, dispenser, earth radiator, ground source heat pump, a cooler arranged for evaporation technique, mixture or replacement of the heat transfer liquid and liquid coming from process water, surrounding water, water tap, water supply.

The thermal system comprising also a secondary loop with one, each or more heat dissipation units of selected from the same group as named for the primary loop The thermal system comprising a primary and secondary loop with one or more of the named heat dissipation units, wherein the activation or operating level of the heat dissipation units preferably can be random and/or temporary.

In yet a further embodiment, the system can further comprise at least one inlet for introducing relative cool cooling liquid to the primary loop and/or the reservoir and/or comprises at least one outlet for discharging relative hot cooling liquid from the primary cooling channel and/or the reservoir. Hence, at least a part of the cooling liquid accommodated in the primary cooling channel and/or the reservoir can be replaced by relative cool cooling liquid. For instance, the inlet may be or comprise a connector or a tube for connection to a water tap. Consequently, relative cold water can be introduced into the systems primary cooling channel and-or reservoir. The outlet may for example be or comprise a connector and-or a tube which may be used for draining relative hot cooling liquid, preferably water, to a sink or other drain. In such embodiment the heat transfer of the fluid of the inlet and the fluid of the cooling channel can be arranged for replacement of the fluids, mixture of the fluids or transfer the heat with a heat exchanger between the fluids.

The disclosure also relates to a heat transferring system, preferably a cooling system according to one of the embodiments above, said heat transferring system comprising multiple stacked thermoelectric elements arranged for transferring heat from their respective cold side for heat uptake to their respective hot side for heat dissipation, and comprising first channel parts for accommodating a cooling liquid for cooling the respective hot side, wherein preferably, in use, the hot side of the thermoelectric element is in direct contact with the cooling liquid, the system further comprising second channel parts for accommodating a liquid to be cooled, wherein preferably, in use, the cold side of the thermoelectric element is in direct contact with the liquid to be cooled in order to abstract heat from said liquid to be cooled, wherein at least one, and preferably each, of the first channel parts is, seen in a stacking direction, traversing at least one and preferably two second channel parts neighbouring said first channel part. By the traversing of said channels, it can be counteracted that heat is unintentionally transferred from heated up cooling liquid to cooled down cooling liquid, because ends of the respective first and second channel parts can be set apart from each other relatively well.

To enhance the thermal heat transfer of the device, the device is arranged for having minimized heat loss from the primary loop to the secondary loop, further stated as cold loop and warm loop, within the embodiment. The embodiment positions the channels of the two loops within the embodiment separate and away from each other due to the physical construction and positioning of the cooling channels, in a way that unintentionally heat transfer from the warm channels to the cold channels is avoided or limited. Preferably by positioning the flow traversing at the different sides of the thermoelectric element results in a position for the channels being left and right for the primary loop and being top and bottom for the secondary loop, thus positioned without unnecessary thermal conductive contact. Furthermore low thermal conductive materials like plastics are used for the embodiment and/or thermal barriers are arranged for minimum heat loss between the two liquid flows.

In preferred embodiments, the multiple stacked thermoelectric elements are stacked such that the cold side of a first thermoelectric element is facing the cold side of second thermoelectric element and its hot side is facing the hot side of a further thermoelectric element. Consequently, unintentional heat transfer from heated up cooling liquid to cooled down cooling liquid can be counteracted and/or insulation can be minimized, as a consequence of which the size of the heat transferring system can be kept relative small and efficient.

Preferably, each element of the multiple stacked thermoelectric elements is facing up with the other side than the element neighbouring above is. Hence, every cold side is facing a cold side of a neighbouring element and every hot side is facing a hot side of a neighbouring element.

In a yet further embodiments, the multiple stacked thermoelectric elements have a space between the different surfaces of the thermoelectric elements for convection by means of a liquid flow. To increase the thermal surface transmittance it is important to reduce the stagnant film layer that occurs on the transmitting surface of the thermoelectric element by the passing fluid. The convective heat transfer coefficient of the forced convection at the thermal transmitting surface is improved by affecting the physical fluid properties and physical situation by an intermediate construction element between the thermoelectric elements. This plate manipulates the type of flow characteristics such as fluid velocity, fluid direction, laminar or turbulent flow by impingement to the transmitting surface, jet-points, suction points, turbulators, spoilers, constrictions, choked channel height, pillars or partition walls.

The thermal system also relates to a heat transferring system, preferably a heating system according to one of the systems of embodiments above, said heat transferring system comprising a integration unit, such as a central reservoir, whereto different heat generating systems are connected to create an integral system. Such integration unit system facilitates connecting different generating heat systems to each other which operate or delivers heat on different or variable temperatures, or with variable power.

Additionally or preferably the connection of the heat generating systems are connected to the cold loop of the thermoelectric element. This allows the system to control easily the different variations of heat generation systems to create a heat pump effect.

In this way the system is able to use all potential available heat energy. When there is a temporary surplus or overrun of heat energy, this is can be temporary be stored or transferred to a dissipation device. The heat generating systems can be for example a solar collector, water heater, systems/devices that heat up a liquid flow for cooling the system/devices it selves, batteries, ground source heat pump, connection a device with waste thermal energy, or devices selected from the heat dissipation units as earlier stated.

In a further thermal system preferably a heating system, additional heat is abstract with a heat dissipation device, used in a way that thermal energy is brought into to liquid flow. Instead of the expelling the heat to the surrounding it now absorbs heat from the surroundings. This is realized by the relatively cold loop of the heat transferring system, at least colder than the surroundings of the dissipation device. In conventional systems working with for example vapour compression coolers, the components used are not suitable or designed for such application and are mostly not suited when condensation or congelation occurs to for example the radiator. For example, the fan of the dissipation unit will hit the ice on the radiator causing failure of the system and/or component. The thermal system is arranged to function at different circumstances. In a normal situation the dissipation device is colder than the ambient air so that inlet air is cooled done after leaving the device, what means that thermal energy, heat, is absorbed by the dissipation device. Depending on the circumstances it may also occur that condensation of water vapour occurs or even congelation/ice-forming to the dissipation device. This still means that thermal heat is absorbed from the surroundings. When congelation/ice-forming occurs to the dissipation device, the heat pump effect, absorbing energy from the surroundings, is limited or is undesirable because it can cause defects on the dissipation device. By heating up the dissipation device temporary, the condensation or ice can be released from the device, by drainage and/or dripping of or melting, and the device is ready for a new heat pumping cycle. The heating can be realized by turn of, connecting to the heat or by switching heat flux of the thermoelectric element. Further a special heat dissipation, preferable used heat absorbing device, can be designed to realise the conditions as mentioned above and to use the congelation/ice-froming as PCM feature to enhance the heat pump effect.

In a further thermal system preferably a heating system, the heat dissipation unit is an earth radiator, ground source heat pump. This device is put into the ground and uses the temperature/heat capacity of the surrounding soil/ground to absorb or to dissipate thermal energy. Because the soil/ground is the limiting factor of the heat transfer, the design can rather be very simple and can be realised by a simple hole made by an auger and entering a plastic tube with watertight capped ends and an inside tubing that runs up to the bottom of the tube and arrange at that position the entering of the liquid into the tube, like circular a pipe, and letting the liquid flow to the top of the tube making contact to the walls of the tube, and a connection at the top for the out coming liquid. Preferably the system is a low pressure water circulating system. Preferably water is used as cooling liquid and the connecting tubing to the heat transfer system is under the ground and enters the building, like a house, from the bottom.

In an alternative thermal system, the hot loop is connected to the cold loop of another thermoelectric cooling device for achieving more temperature difference due to the cascade of the loops.

In an alternative thermal system, the system is used for electric energy generation, wherein the primary loop is connected to a relatively warm loop and the secondary loop is connected to a relative cold loop. Because of the temperature difference a heat flux occurs from the cold side of the thermoelectric element to the warm side of the element causing generation of an electric current. This electric current is generated due to the so called "Seebeck effect"

In an alternative thermal system, the system also relates to a heat transferring system wherein the thermoelectric element is not activated by electrical power and functions just as a passive intermediate element between the two liquid flows to exchange heat between the primary loop and the secondary loop.

BRIEF DESCRIPTION OF THE DRAWING FIGURES

Description of the Figures

Thus forming the mentioned devices an integral connection to each other but not limited to all of the devices as stated. Only for drawing reasons the connections are made to the central reservoir what forms a part of the cooling channel of the thermoelectric element and it shall be clear for person skilled in art that any alternative combinations are within the scope of the invention

DETAILED DESCRIPTION OF THE INVENTION

Legends of the Figures

Figure 1:
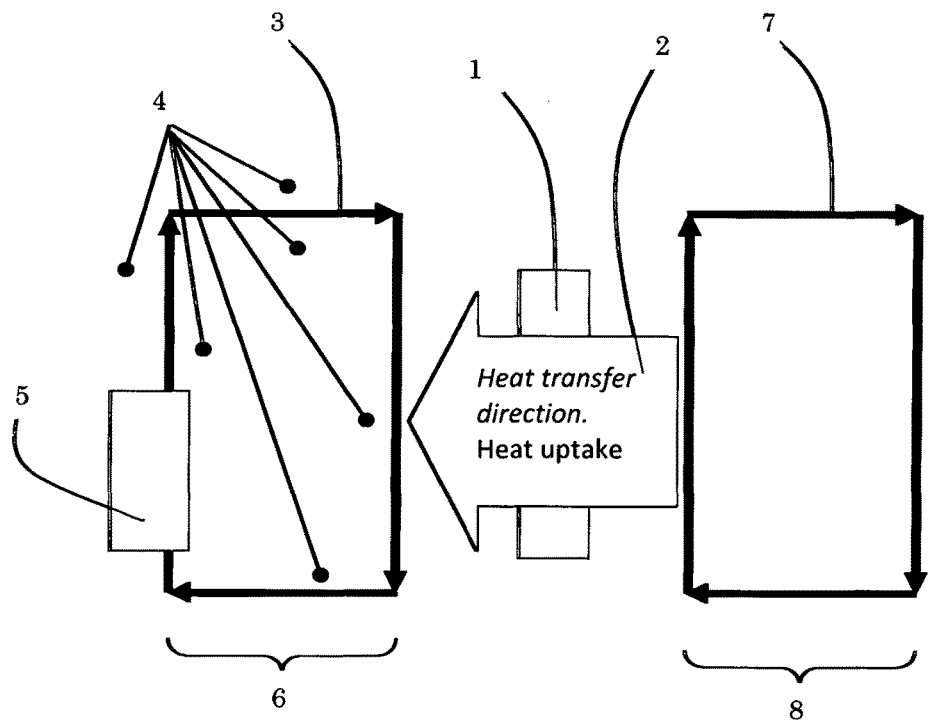
FIG. 1 is a representation of a typical heat transferring system wherein the thermoelectric element [1] is transferring heat [2] to a relative warm cooling channel [3] of the primary loop [6] from a relative cold cooling channel [7] of the secondary loop [8]. Wherein the surroundings [4] of the cooling channel are able to expel heat and wherein a heat dissipation device [5] is able to expel heat to the surroundings.
Figure 2:
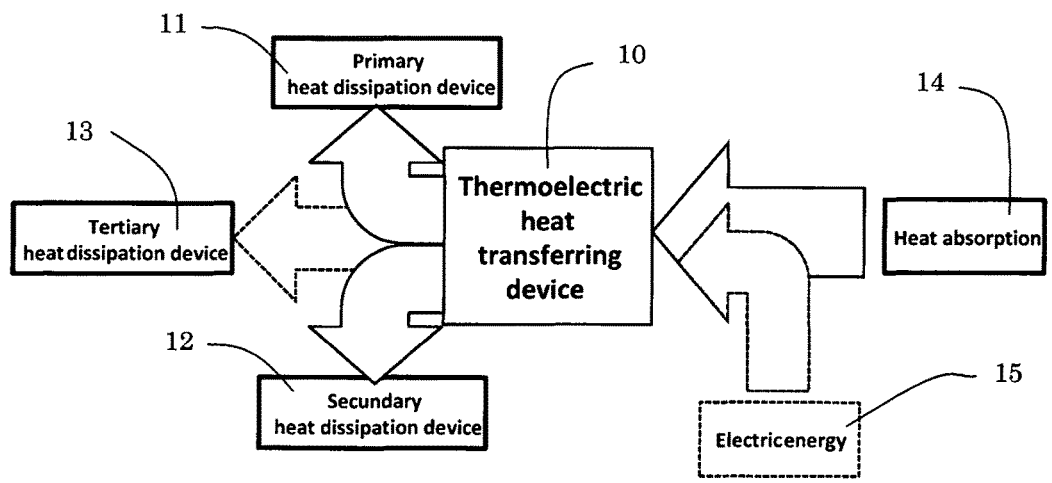
FIG. 2 represents a schematic representation of directions of the energy flows wherein a thermoelectric heat transferring device [10] absorbs transfers heat from a medium [14] and electric energy [15] and transfers the energy to a primary heat dissipation device [11] and/or a secondary heat dissipation device [12] and/or but not limited to an tertiary dissipation device [13]
Figure 3:
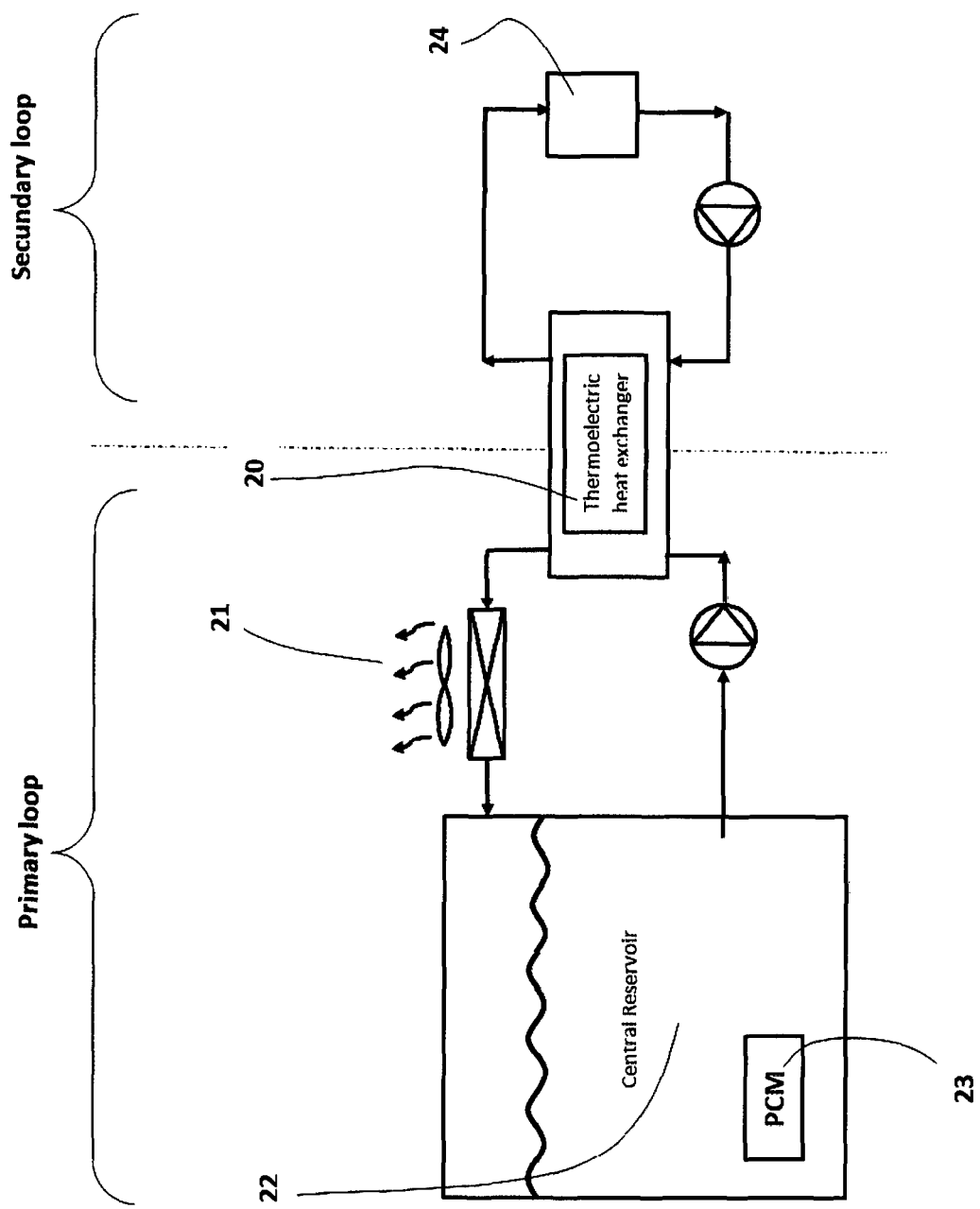
FIG. 3 represents a heat transferring system with a thermoelectric heat exchanger [20] wherein the primary loop is connected to a radiator with a fan [21] and a central reservoir with storage capacity [22] and integrated Phase Change Material [23], the secondary loop is connected to at least one heat dissipation device.
Figure 4:
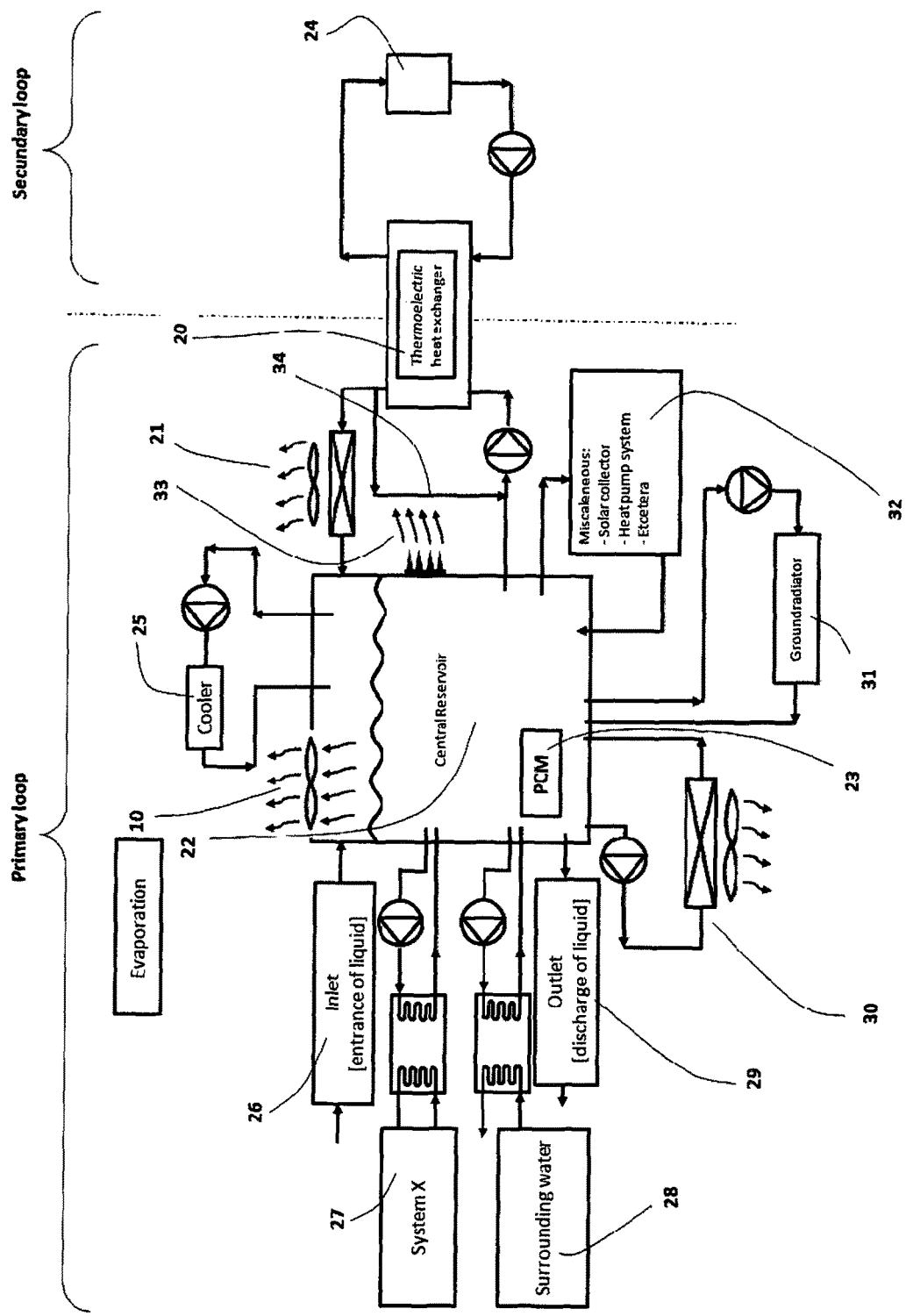
FIG. 4 shows a theoretical representation of all kinds of different heat dissipation devices, which could not be practical, connected or combined to each other. Wherein a thermoelectric heat exchanger [20] is connected to a central heat reservoir [22] for storage of heat, wherein the capacity is improved by PCM [23] wherein the reservoir and/or loop is arranged for evaporation of liquid [10] wherein an inlet [26] is arranged for entering (relatively cold) liquid into the reservoir wherein heat is transferred from or to an additional system [27] wherein a liquid to liquid heat exchanger is connected to the surrounding water [28] wherein a outlet [29] is arrange for discharging liquid wherein a additional radiator loop [30] with or without a fan, or with or without a pump is connected to the central reservoir, wherein a ground radiator or Ground Source Heat Pump [31] is connected to the central reservoir wherein a heat generating system [32] is connected to the central reservoir wherein a cooler [25] is connected to the central reservoir for creating a hybrid system, wherein the reservoir is able to dissipate heat with or without additional features [33] like a thermal conductive material or heatsink with or without a fan, wherein a shortcut [34] of the flow is made coming from the thermoelectric heat exchanger and a radiator [21] with or without fan is part of or connected to the loop. The system further comprises a secondary loop with a heat dissipation device [24] or a combination of heat dissipation devices as mentioned for the primary loop.
Figure 5:
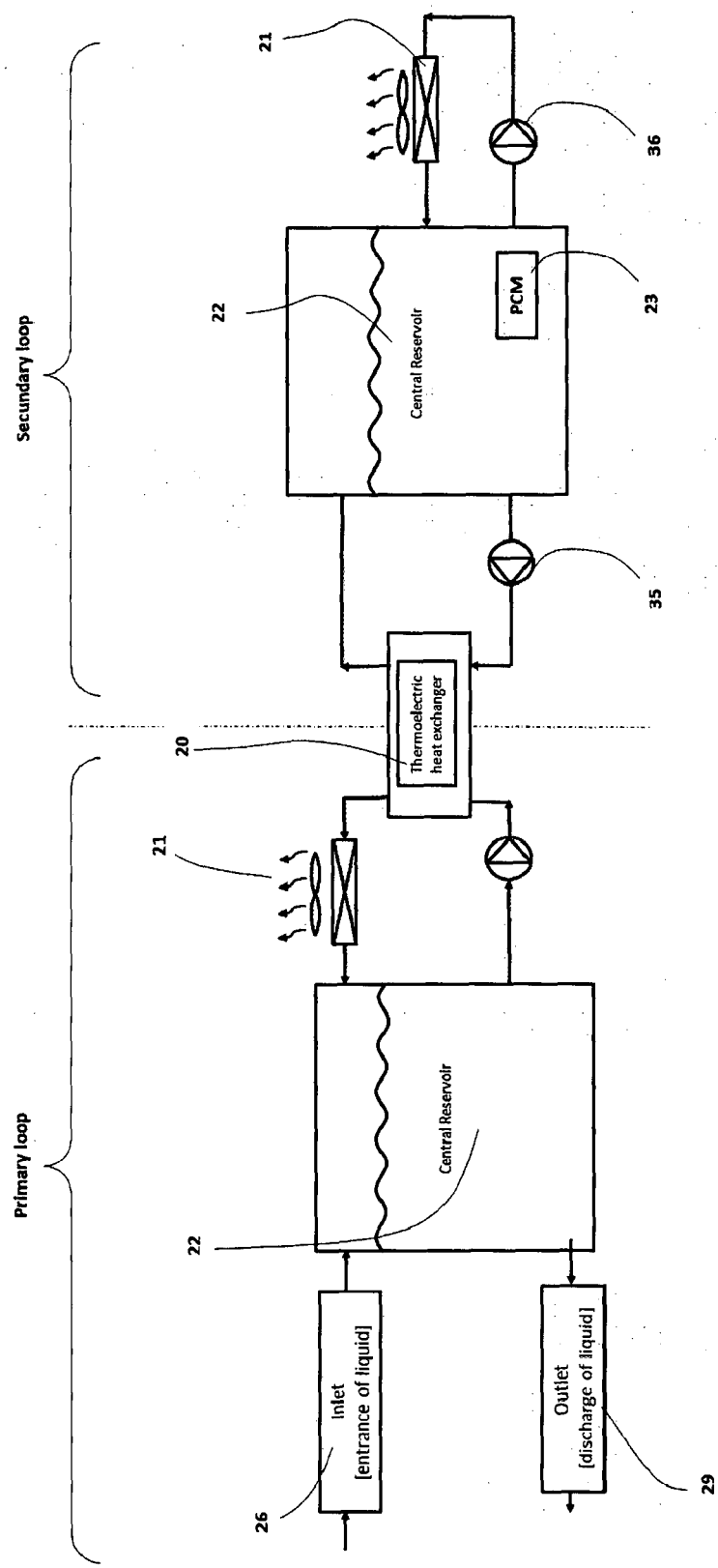
FIG. 5 represents a heat transferring system wherein the thermoelectric heat exchanger [20] is connected to the primary loop which is arranged with a radiator with a fan [21] connected to a reservoir [22] wherein low temperature water is entered at the inlet [26] and wherein a discharge [29] for outcoming liquid. The secondary loop is provide with a pump [35] and a reservoir [22] with integrated PCM [23] and a radiator and fan for dissipation/absorption of heat.
Figure 6:
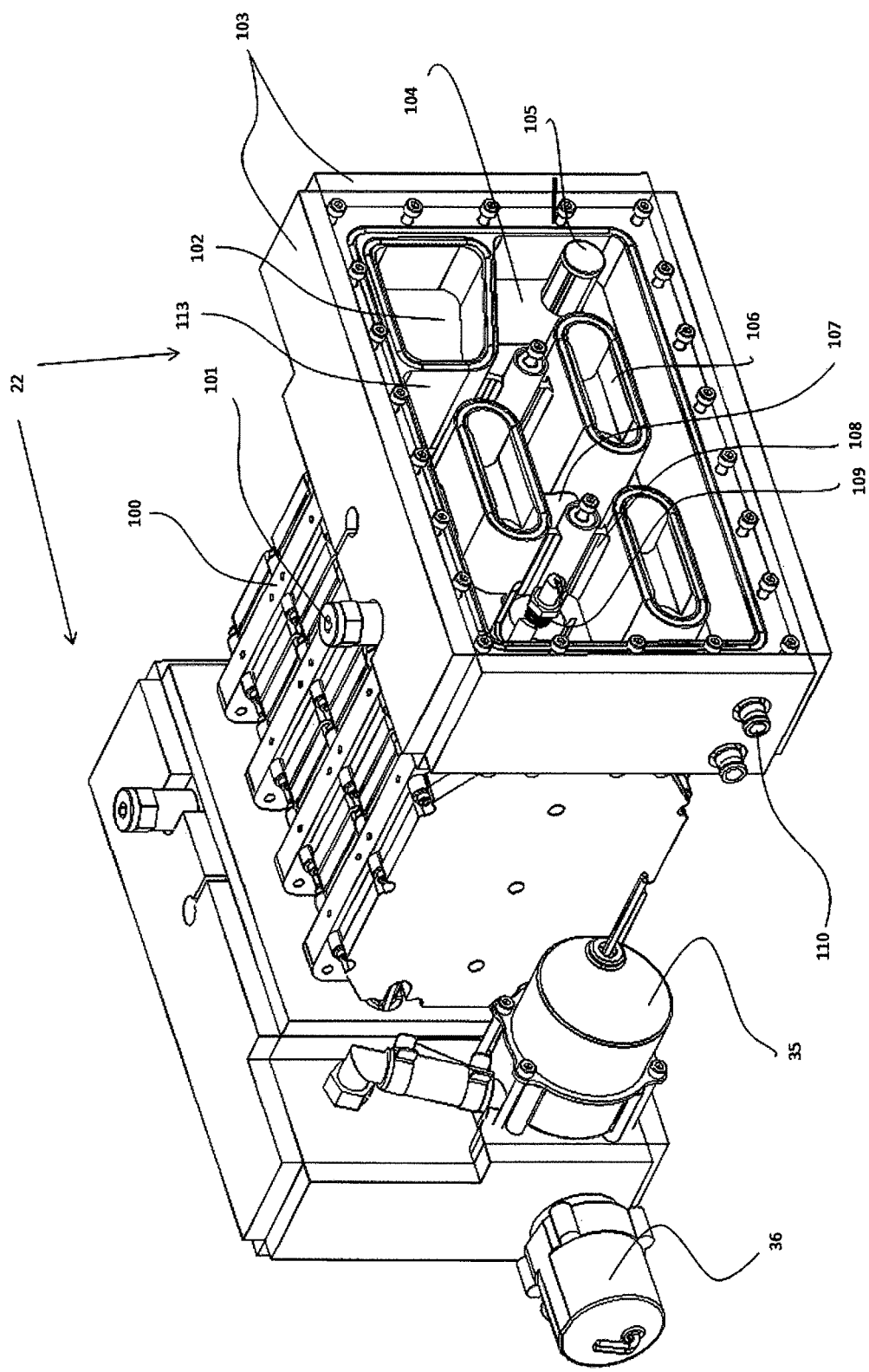
FIG. 6 shows a integration of a thermoelectric heat transfer unit with two reservoirs [22] and a pump [35] for the internal loop, and a pump [36] for the external loop to a heat dissipation device like a radiator. The two reservoirs are positioned so that thermal loss is minimized and the reservoirs are insulated with insulation [103]. The front cover of the reservoir is not shown and the internal components of the reservoir are a pressure chamber [102] coming from the pump (on the backside, not vissible), a filter [105] for filtering the liquid before it is sucked into the pump, a connection part [106] for connecting the thermoelectric units [100], wherein the reservoir has a certain volume [104] for comprising cooling liquid and/or PCM, and wherein mixture walls [108] are arranged for proper mixture of different liquid flows, and wherein a level sensor [107] is placed to monitor the height of the liquid in the reservoir, and wherein a flow sensor [109] monitors if there is sufficient flow, and wherein a pressure switch [101] is provided for controlling the maximum pressure inside the reservoir, and wherein there is space [113] for enclosed air to absorb fluctuations of the pressure during expansion of the fluid.
Figure 7:
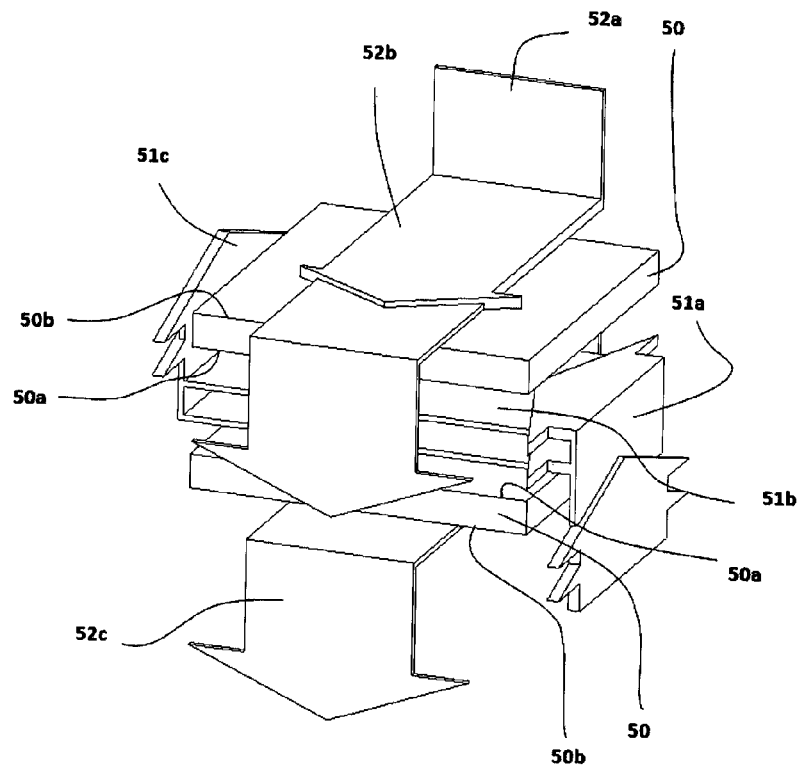
FIG. 7 represents a schematic view of two thermoelectric elements [50] positioned with both cold sides [50a] to facing each other, with a passing relative cold liquid coming from the cold inlet [51a] contacting the cold transmitting surface [51b] of the thermoelectric element [50a] and leaving the embodiment at the cold outlet [51c], with a passing relative warm liquid coming from the warm inlet [52a] contacting the cold transmitting surface [52b] of the thermoelectric element [50b] and leaving the embodiment at the warm outlet [52c]
Figure 8:
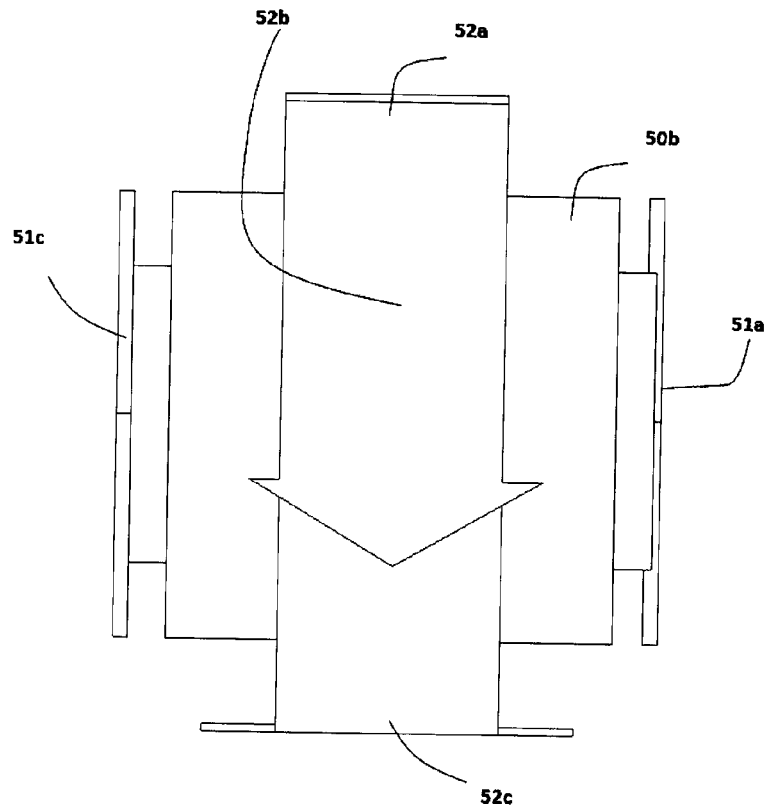
FIG. 8 represents a schematic top view of the describes flows in FIG. 7 wherein the cold liquid flow is from the right to the left, and the warm liquid flow is from the top to the bottom, thus preventing heat loss between the fluid channels part of the primary and secondary loop.
Figure 9:
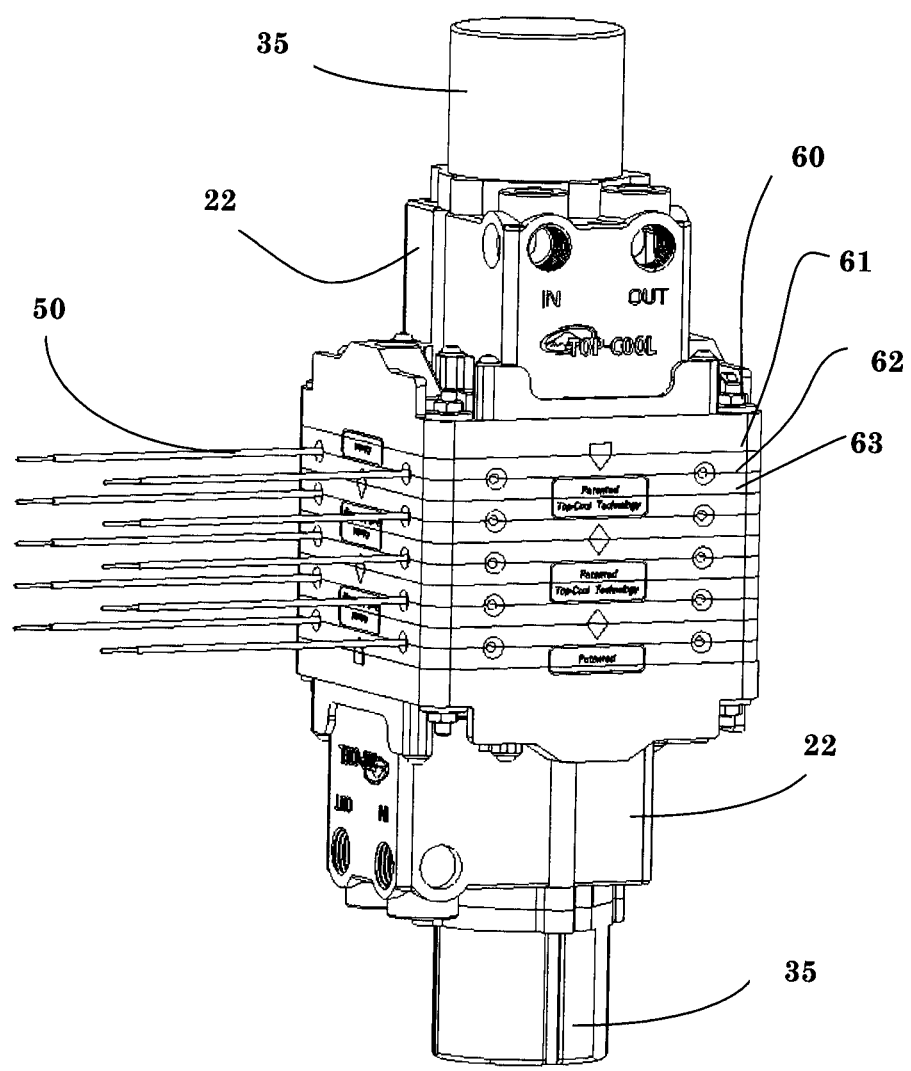
FIG. 9 represents a thermoelectric heat exchanger with integrated reservoirs [22] thermoelectric elements [50] (outcoming wires shown) pumps [35] and a fasteners [60] for holding the different channel parts or components together, wherein a bonding [61] is made of a top-plate and a carrierplate [63] and wherein a bonding [62] is made for two carrierplates.
Figure 10:
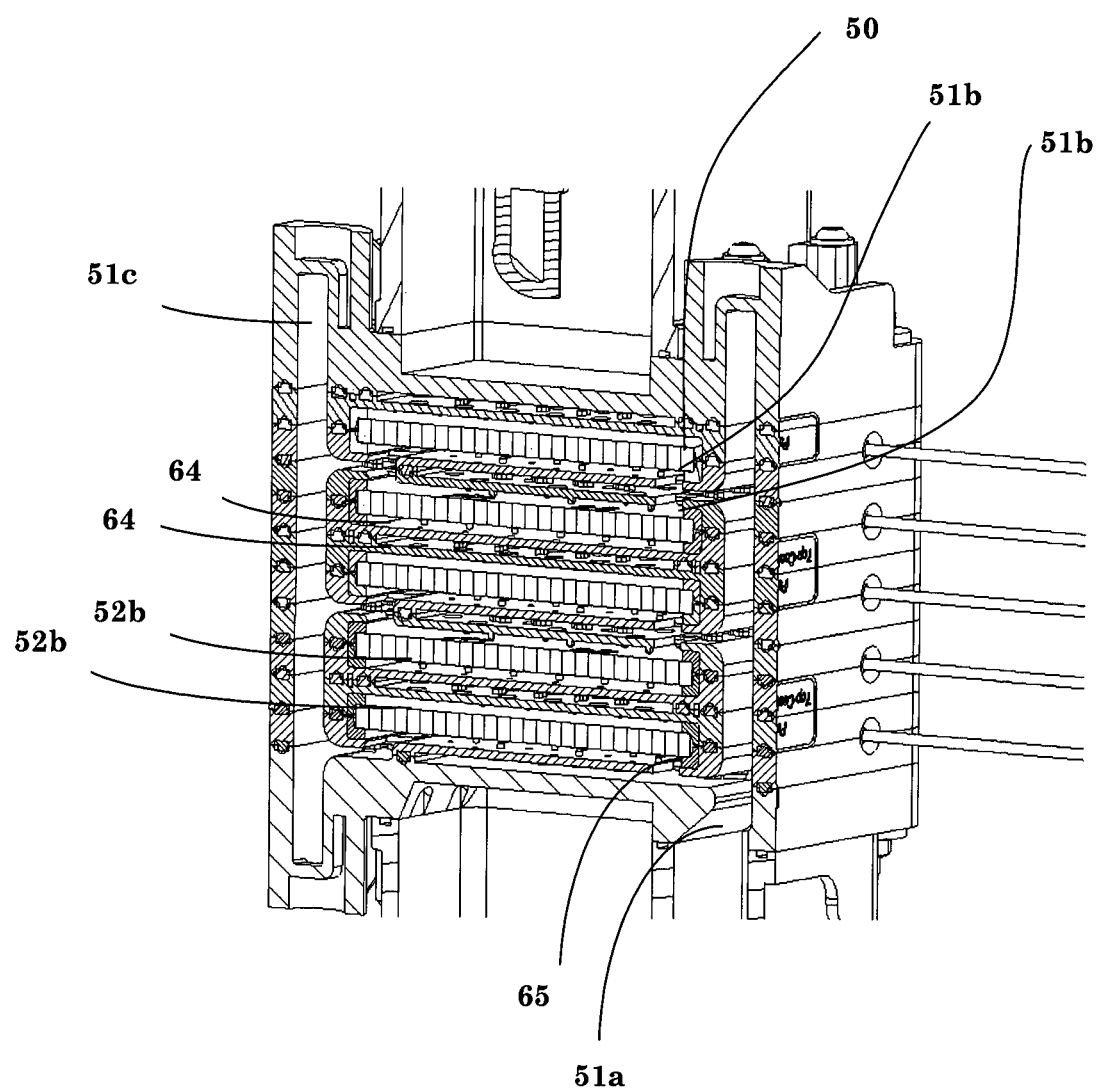
FIG. 10 represents a cross-section of a thermoelectric heat exchanger wherein a channel is made for the inlet of cold liquid [51a], wherein a cold channels [51b] is arranged for the passing liquid to contact the heat transmitting surface of the thermoelectric element [50] wherein a intermediate construction element [64] manipulates the type of the passing flow to create a better heat transfer due to reduced stagnant film layer on the heat transmitting surface of the thermoelectric element caused by, for example higher fluid velocity, turbulators, jet-points. The opposite side of the thermoelectric element has a traversing liquid flow in the warm channel [52b]. The thermoelectric element [50] is embedded in flexible gaskets [65] to seal the cooling channels [51+52] and to protect the thermoelectric elements for thermal expansion and retraction, vibration and mechanical shocks.
Figure 11:
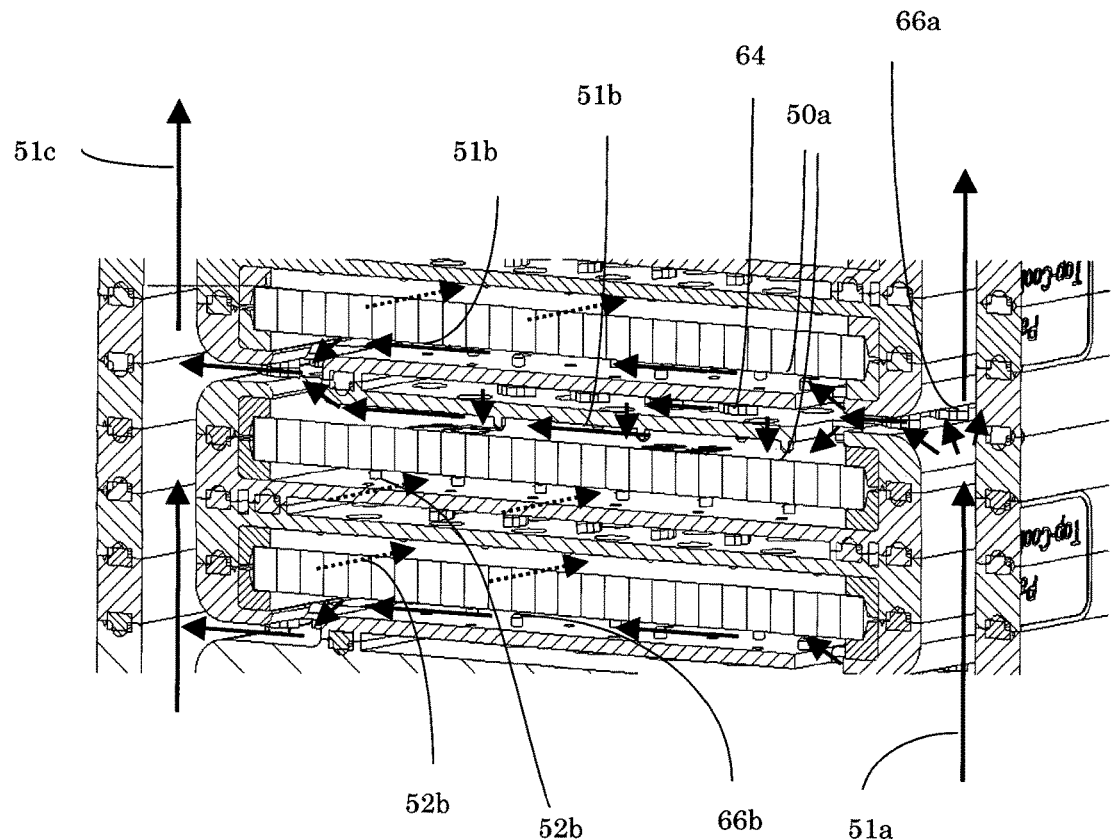
FIG. 11 represents a more detailed view of the flow directions and the manipulation by the intermediate construction element [64] wherein a cold liquid flow enters the channel [51a] and further enters in the direction of the heat transmitting surface of the thermoelectric element [50a] between pillars [66a], the intermediate construction element [64] manipulates the flow and redirected the flow across the heat transmitting surface of the thermoelectric element [50a] The pillars [66b] secures the ceiling to obstruct the flow when deformation should occurs of the intermediate construction element[64].
Figure 12:
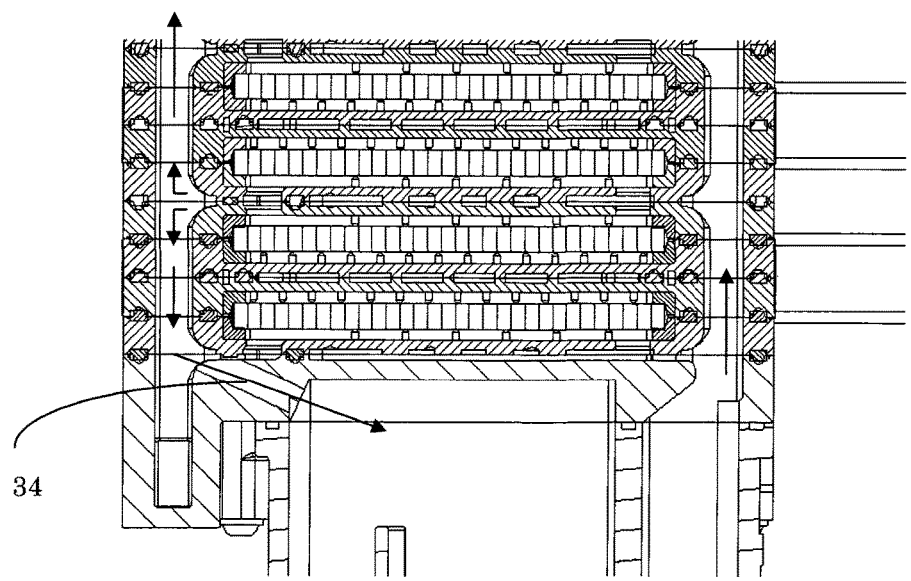
FIG. 12 represents a cross-section of a thermoelectric heat exchanger wherein a internal shortcut [34] is connected to the reservoir to increase the flow of the passing liquid in the channel of heat transmitting surface of the thermoelectric element.
Figure 13:
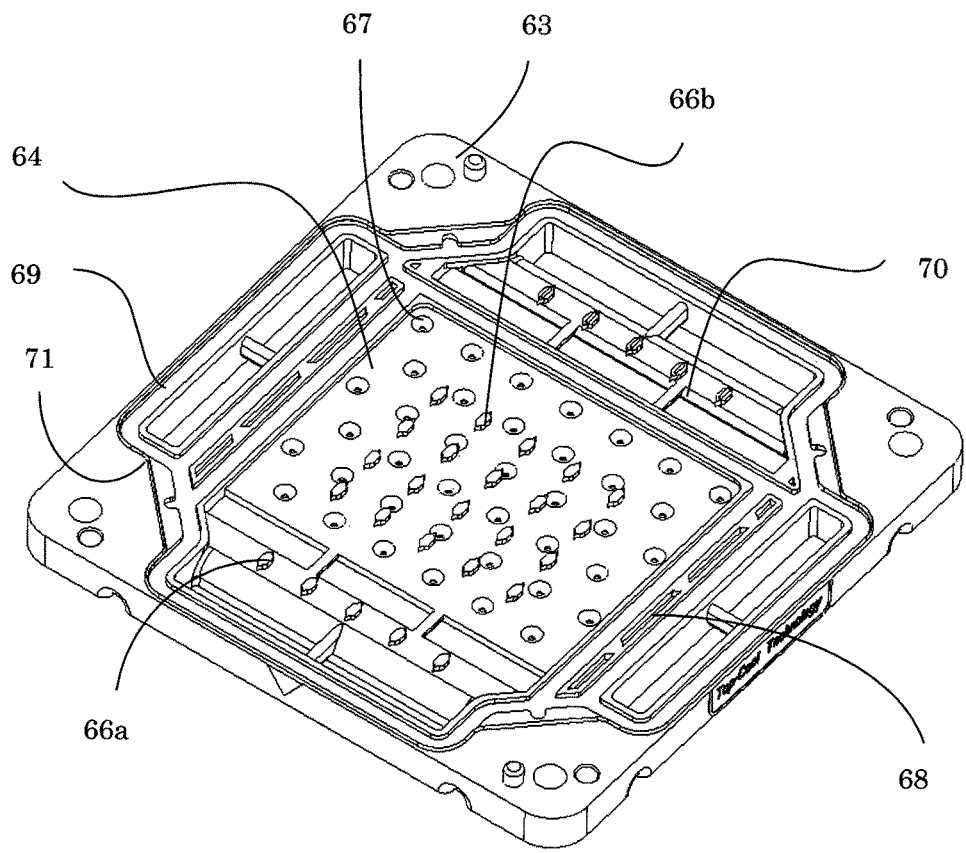
FIG. 13 represents a carrierplate [63] with pillars [66a] to support the gasket (not shown) and to maintain the space between the bottom and the ceiling, wherein the intermediate construction element [64] has pillars [66b] that can also manipulate or redirect the flow as spoilers and/or jet-points and/or impingement features [67] wherein a thermal barrier is placed [70] to insulate the two (cold and warm) loops within the device, and wherein the sealing can be applied into a groove [69] and or wherein a sealing [71] and/or bonding is applied with, for example a weld or glue.
Figure 14:
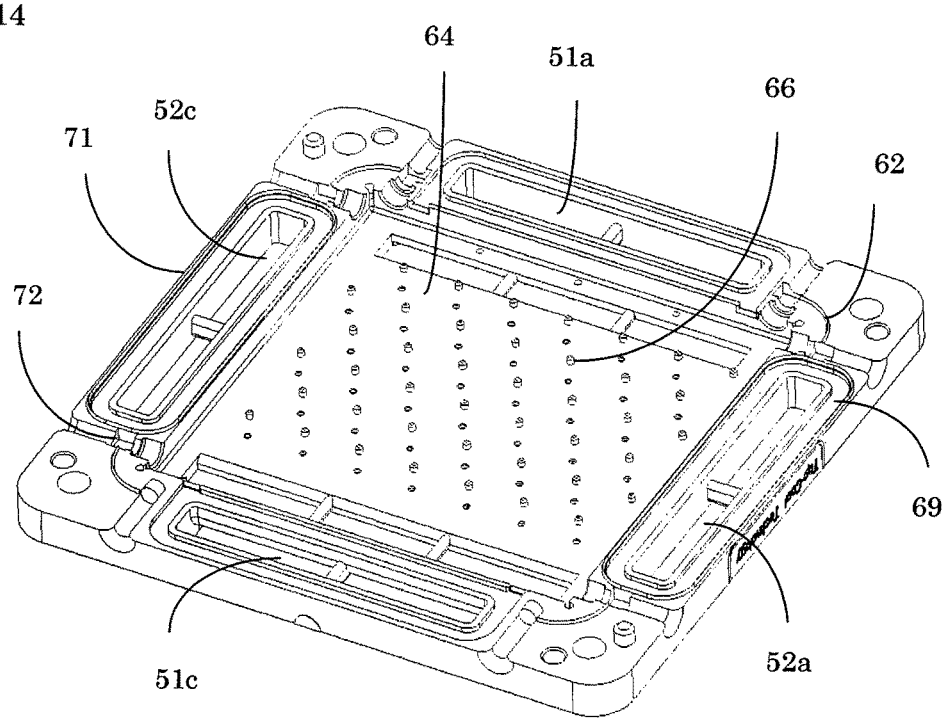
FIG. 14 shows a representation of the backside of the carrierplate wherein the inlet [51a] and the outlet [51c] of the cold cooling channel are separated from the inlet [52a] and the outlet [52c] of the warm cooling channel, wherein the intermediate construction element [64] has protruding pillars [66] and wherein a bonding can be made at the corners [62] or around the sealing [69] of the channel part [71], and wherein an additional wire sealing can be applied [72]
Figure 15:
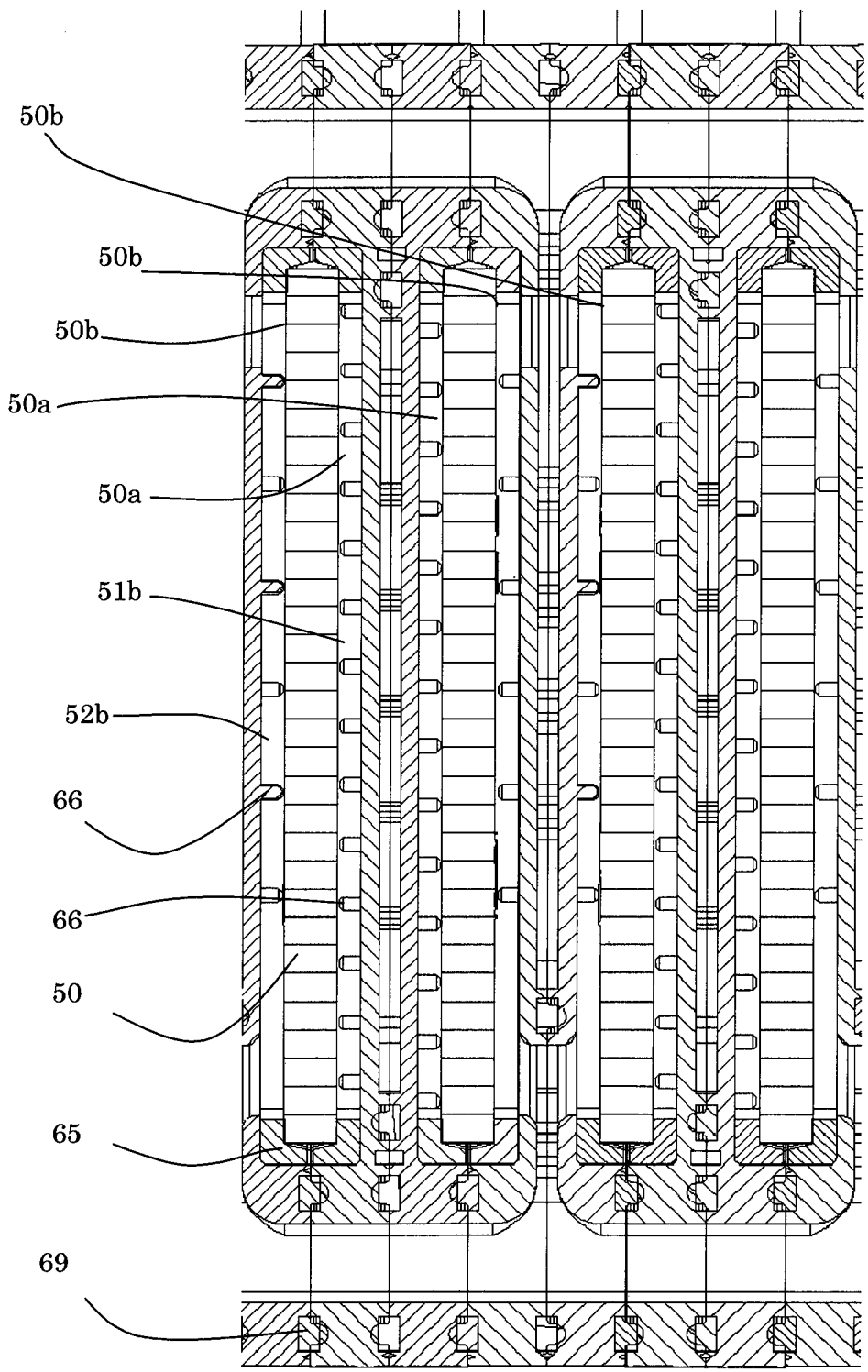
FIG. 15 shows cross-section of the embedded thermoelectric elements wherein the cold sides [50a] of a thermoelectric element [50] are facing each other and the warm sides [50b] of the thermoelectric element are facing each other, thus forming a set that can easily been stacked while maintaining the orientation of the facing sides of the thermoelectric elements. The drawing further show the pillars [66] that holds up the ceiling but with limited contact to the thermoelectric heat transmitting surface, preferably not contacting at all.
Figure 16:
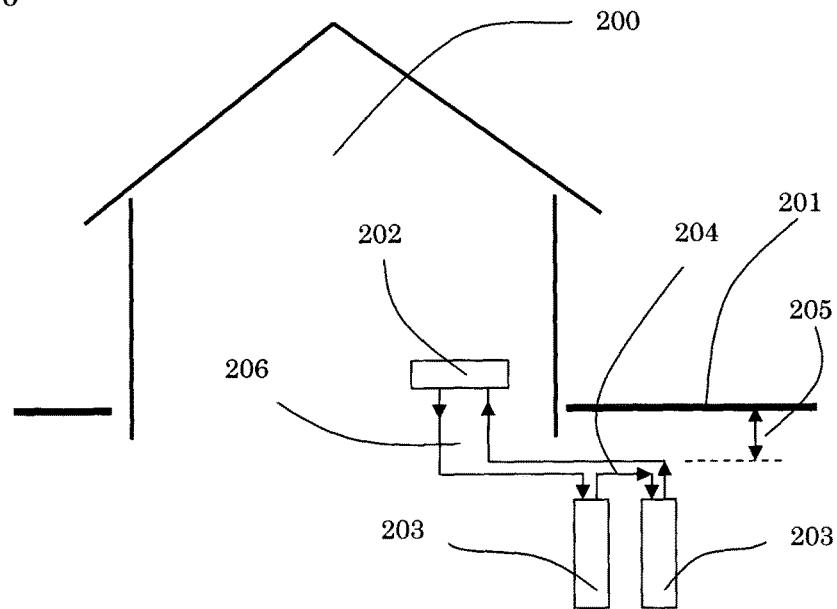
FIG. 16 represents a building [200] with a heat transferring device [202] that is connected to a earth radiator, ground source heat pump (GSHP) [203], wherein different ground source heat pumps are positioned under [205] the ground [201] and with a distance to each other and connected [204], and wherein the coupling [206] to the heat transferring device is under the building
Figure 17:
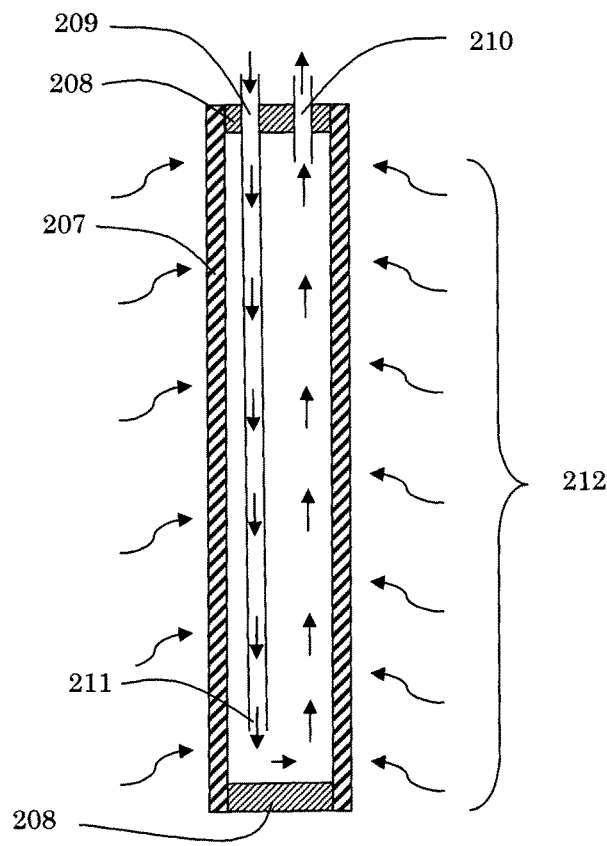
FIG. 17 represents an earth radiator, ground source heat pump, wherein a tube, preferably a circular plastic pipe [207] with capped ends [208] is provided with a connector on top for incoming liquid [209] with a tubing that runs up the bottom part of the tube with an opening [211] allowing the liquid, preferably water, flowing upwards contacting the inner walls of tube [207] for absorption of heat [212], and wherein on top the outlet coupling is provided [210]
Figure 18:
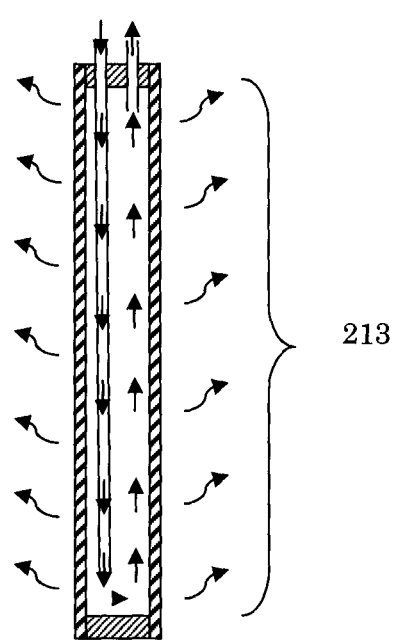
FIG. 18 represents an earth radiator, ground source heat pump, wherein heat is dissipated to the ground/soil [213]
Figure 19:
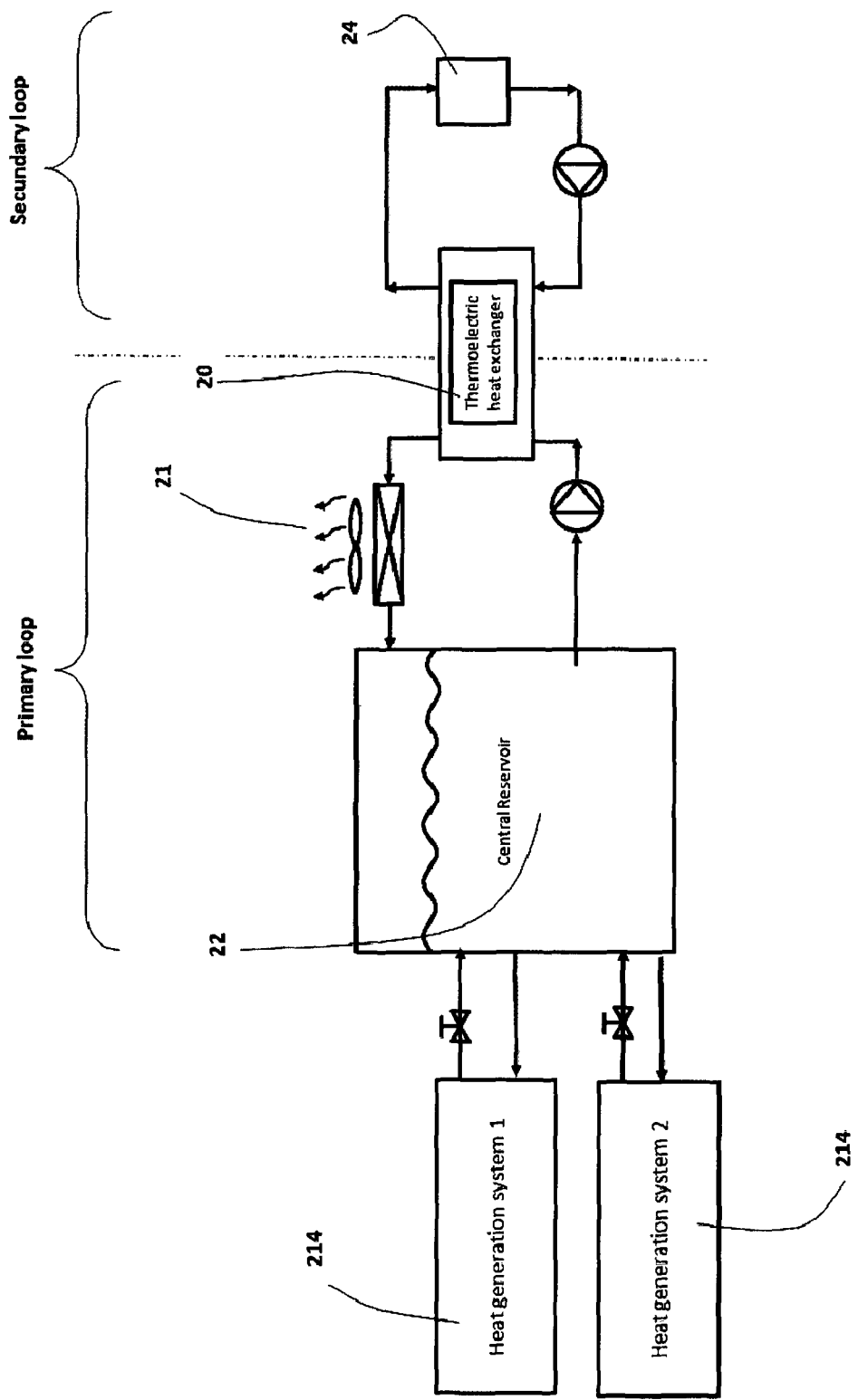
FIG. 19 represents a heat transferring system, preferably a heating system wherein the system comprises a thermoelectric heat exchanger [20] that is connected to a central reservoir [22] functioning as an integration unit wherein several different heat generation systems [214] are connected delivering heat for example relatively warm water and wherein the primary loop is connected to the cold side of the thermoelectric element, and optional a heat dissipation unit, like a radiator [21] is connected to dissipate surplus heat, or is used as heat absorption unit as well. The secondary loop is connected to a heat dissipation device [24] for example floor heating based on water circulation.

1. Thermoelectric element
2. Heatflux through thermoelectric element
3. Cooling channel primary loop
4. Surroundings cooling channel
5. Heat dissipation device
6. Primary loop
7. Cooling channel secondary loop
8. Secondary loop
10. Thermoelectric heat transferring device
11. Primary heat dissipation device
12. Secondary heat dissipation device
13. Tertiary heat dissipation device
14. Heat absorption
15. Electric energy
20. Thermoelectric heat exchanger
21. Radiator with fan
22. Central reservoir
23. Phase change Material (PCM)
24. Heat dissipation device (to release or absorb heat)
25. Cooler (for example but not limited to vapour compression cooler)
26. Inlet of new entering liquid
27. Heat transferring system with heat exchanger
28. Heat transferring system with heat exchanger from surrounding water
29. Outlet of liquid (discharge to for example drain)
30. Radiator with optional fan
31. Groundradiator (Ground Source Heat Pump)
32. Heat transferring unit (miscellaneous)
33. Heat dissipation of reservoir (heatsink)
34. Shortcut of cooling channel
35. Pump thermoelectric heat exchanger
36. Pump radiator loop
50. Thermoelectric element
50a. Cold side thermoelectric element
50b. Warm side thermoelectric element
51. Cold channel
51a. Cold channel inlet device
51b. Cold channel heat transmitting surface
51c. Cold channel outlet device
52. Warm channel
52a. Warm channel inlet device
52b. Warm channel heat transmitting surface
52c. Warm channel outlet device
60. Fastener housing
61. Bonding top-plate and carierplate
62. Bonding carierplate and carierplate
63. Carierplate
64. Intermediate construction element
65. Flexible gasket
66. Pillars
66a. Pillar for entrance flow
66a. Pillar at heat transmitting surface
67. Impingements, jetpoints, suction points
68. Thermal barrier
69. Sealing
70. Spreader
71. Sealing by bonding
72. Sealing wire
100. Thermoelectric device
101. Overpressure valve
102. Pressure room
103. Insulation
104. Intern volume reservoir
105. Filter
106. Connection of thermoelectric units
107. Level switch
108. Mixture walls
109. Flow switch
110. Outlet coupling
113. Air pressure space
200. Building
201. Ground
202. Heat transferring device
203. Earth radiator, Ground Source heat Exchanger
204. Connecting tubing
205. Height under ground
206. Entering the tubing
207. Wall of tube
208. Capped ends
209. Inlet coupling
210. Outlet coupling
211. Outcoming fluid position of incoming liquid
212. Ground source heat absorption
213. Ground source heat dissipation
214. Heat generation system/device The invention is not limited to the embodiments, heat dissipation devices or system components described in the application. The thermoelectric elements are not limited to the standard Peltier devices, TEM's, TEC's or TEG's available on the market but also other models with our without ceramic or metal surfaces, thin film variants or made by different manufacturing methods or thermoelectric elements with nano-technology or other future versions. Many variants or combinations are possible. Similar variants shall be clear to the person skilled in art and are to be considered to be within the scope of the invention, as defined in the following claims

The invention claimed is:

1. A thermal system, comprising a thermoelectric element arranged for a heat flux through the thermoelectric element from the cold side for heat uptake to the hot side for heat dissipation, wherein the heat uptake of the thermoelectric element is arranged by convection, the system further comprising a primary loop for accommodating a cooling liquid for transferring the heat away of the thermoelectric element, wherein the thermoelectric element is arranged for having a maximum heat transfer capacity being higher than the maximum heat dissipation capacity of the primary loop and/or wherein the system is arranged for, manipulation of the flow which affects the stagnant film layer at a heat transmitting surface of the thermoelectric element of the forced convection, to enhance the heat transfer coefficient, and/or wherein a part of the primary loop forms a liquid channel for the heat transmitting surface of the thermoelectric element wherein the direction of the flow is traversing the direction of the liquid flow of the opposite side of the thermoelectric element.

2. A thermal system according to claim 1 wherein the thermoelectric element is arranged for having a maximum heat transfer capacity being higher than the maximum heat dissipation capacity of the primary loop and the primary heat dissipation device connected to the primary loop, wherein the dissipation device is; a radiator, heat exchanger, heatsink, heat storage buffer, Phase Change Material (PCM), liquid cold plates, heat spreaders, heatpipes, fine wire heat exchanger, Phase Change Coolers, a fan cooled heat exchanger, liquid to liquid heat exchanger, vapour compression cooler, evaporative cooler, vessel, open loop, dispenser, earth radiator, ground source heat pump, a cooler arranged for evaporation technique, mixture or replacement of the heat transfer liquid and liquid coming from process water, surrounding water, water tap, or water supply.

3. A thermal system according to claim 1, wherein the thermoelectric element is arranged for having a maximum heat transfer capacity being higher than the maximum heat dissipation capacity of the primary loop and the primary heat dissipation device connected to the primary loop and the secondary heat dissipation device connected to the primary loop being of a different type, wherein the system is provided with one or more features having a characteristic wherein at least one side of the thermoelectric element is in direct contact with the cooling liquid; wherein at least one thermoelectric element is flexible embedded (in the housing) in way that the element is protected from any mechanical stresses caused by vibration, shocks or thermal expansion or retraction that may influence on the durability of the element); wherein the thermoelectric element is a cooling element, heating element or electric power generator.

4. A thermal system according to claim 1, wherein said maximum heat transferring capacity being at least 50% higher than the maximum heat dissipation capacity of the cooling channel, wherein the system is provided with one or more features having a characteristic wherein the system further having a heat storing capacity for storing a part of the heat transferred to the primary loop during temporary peak cooling by the thermoelectric element, which part of the heat may be dissipated to the surroundings of said primary loop after said temporary cooling; wherein the system further comprising a heat storing reservoir for at least partly providing the heat storing capacity.

5. A thermal system according to claim 1, wherein the heat storing reservoir, in use, accommodates more cooling liquid than the primary loop contains, wherein the system is provided with one or more features having a characteristic wherein the heat storing reservoir, in use, accommodates phase-change material (PCM); wherein a dissipation device is arranged for activation of phase changes of PCM; wherein the system comprises one or more heat dissipation units connected to the primary loop and/or the heat storing reservoir; wherein a thermal storage device accommodates temporary storage an amount of heat to reduce temperature fluctuations in the primary loop; wherein a thermal storage device is arranged for temporary storage to accommodate an amount of heat and is also being used to dissipate heat dissipation device; wherein a thermal storage device is arranged for temporary storage an amount of heat and also arranged for heat dissipation.

6. A thermal system according to claim 1, wherein the system further comprises at least one inlet for introducing relative cool cooling liquid to the primary loop and/or the reservoir and/or comprises at least one outlet for discharging relative hot cooling liquid from the primary loop and/or the reservoir, such that at least a part of the cooling liquid accommodated in the primary loop and/or the reservoir can be replaced by relative cool cooling liquid or at least a part of the heat removed from the primary loop with the discharging liquid.

7. A thermal system according to claim 1, comprising thermoelectric elements arranged for a heat flux through the element from the cold side for heat uptake to the hot side for heat dissipation wherein the heat uptake of the thermoelectric element is arranged for heat uptake by convection, the system further comprising a primary loop for accommodating a cooling liquid for transferring the heat away of the thermoelectric element, the system further comprising a secondary loop for accommodating a liquid to be cooled, wherein the thermoelectric elements are stacked and the space between two thermoelectric elements is arranged for an intermediate construction element.

8. A heat transferring system according to claim 7 wherein the system is provided with one or more features having a characteristic wherein the main fluid directions of the primary loop and the secondary loop are perpendicular/transverse or at least traversing seen in the stacking direction; wherein the channels of the different loops are thermal insulated from each other due to the position and/or design of the parts in between; wherein the multiple stacked thermoelectric elements are stacked such that the cold side of a first thermoelectric element is facing the cold side of second thermoelectric element and its hot side is facing the hot side of a further thermoelectric element; wherein modular carrier; wherein flexible gaskets are used for embedding the thermoelectric elements; wherein the main fluid directions of the primary loop and the secondary loop are perpendicular/transverse or at least traversing seen in the stacking direction; wherein the thermoelectric elements are standard devices as at state of art like peltier elements; wherein the housing is made from lightweight material; wherein the housing is accommodated for minimal thermal losses due to used low thermal conductive material like plastic and/or the design of the construction with low thermal heat transfer barriers by chambers/gaps filled with air or gas; wherein the housing/carriers of the thermoelectric elements are made of plastic parts that are jointed or welded to each other.

9. A heat transferring system according to claim 1, wherein the flow of the primary loop through the device is in the opposite direction to the flow of the secondary loop conform the counter current exchange principle wherein an intermediate construction element accommodates reduction of the stagnant fluid film layer at thermal heat transmittance surface of the thermoelectric element to the passing fluid wherein an intermediate construction element accommodates reduction of the stagnant fluid film layer at thermal heat transmittance surface of the thermoelectric element to the passing fluid.

10. A heat transferring system according to claim 1, wherein the system is provided with one or more features having a characteristic wherein an intermediate construction element accommodates reduction of the stagnant fluid film layer at thermal heat transmittance surface of the thermoelectric element to the passing fluid; wherein the intermediate construction element accommodates impingements, turbulators, jet-points, suction points, constrictions, choked channel height, pillars, partition walls etc.; wherein the intermediate construction element accommodates a relative low channel height in relation to the width at the position of the thermal transmitting surface of thermoelectric element and the passing fluid wherein obstruction of the flow is prevented due to the pillar construction that holds up the ceiling of the flow channel.

11. A heat transferring system according to claim 1 wherein the system is arranged for maintaining sufficient internal flow for proper thermal heat transfer due to a separate/particular pump or a short-cut that enables sufficient flow over the thermal transmitting surface of the thermoelectric element wherein a shortcut is added to the liquid flow of primary loop for maintaining the flow over the thermoelectric elements for appropriate heat transfer.

12. A heat transferring system according to claim 1, wherein the system is adapted for use for dehumidification by using the cold loop to condensate moisture from the air, and the warm loop to reheat the air being partially cooled down by the cold loop.

13. A thermal system according to claim 1, provided with one or more features having a characteristic wherein additional heat is being added to the system by a dissipation device able to absorb thermal energy from the surroundings even when congelation/ice-forming occurs to the device; wherein additional heat is being added to the system by a dissipation device like a heatsink; wherein congelation/ice-forming to the device is removed by temporary heating up the device; wherein additional heat is being added to the system by a solar collector; wherein additional heat is being added to the system by earth radiator, ground source heat pump; wherein the thermoelectric elements are used on higher voltage as normally is used/maximum in cooling mode; wherein the thermoelectric element is a heating element; wherein the thermoelectric element is an electric power generator; wherein the system is used for cooling and/or heating and/or electric power generation.

14. Use of a heat transferring system according to claim 1, wherein the system is used for cooling and/or heating and/or electric power generation, wherein the system is provided with one or more features having a characteristic wherein the system is used for or heating and where is made use heat pumping: through cooling air, condensation or congelation/ice forming on the dissipation device of the relative cold loop of the system and/or connecting the system to sun collectors, and/or connecting the system to groundwater and/or heat pump system; wherein the system is used for or dehumidification; wherein the system is accommodated for a forced liquid flow in the primary loop where a shortcut is added to the liquid flow of primary loop for maintaining the flow over the thermoelectric elements for appropriate heat transfer; wherein the system is accommodated for an integration unit that facilitates connection of different heat generating systems to each other which operate or delivers heat on different or variable temperatures.

* * * * *